United States Patent [19]

Kamikawai et al.

[11] Patent Number: 5,146,119
[45] Date of Patent: Sep. 8, 1992

[54] SWITCHING CIRCUIT AND ITS SIGNAL TRANSMISSION METHOD

[75] Inventors: Ryotaro Kamikawai, Nishitama; Akira Masaki, Musashino, both of Japan

[73] Assignee: Hitachi, Ltd., Tokyo, Japan

[21] Appl. No.: 458,161

[22] Filed: Dec. 28, 1989

[30] Foreign Application Priority Data

Jan. 13, 1989 [JP] Japan ................... 1-004997

[51] Int. Cl.$^5$ ...................... H03K 3/38; H03K 17/92; H03K 19/195
[52] U.S. Cl. .................... 307/476; 307/245; 307/306; 505/861; 505/829; 505/865
[58] Field of Search .............. 307/306, 245, 476, 462, 307/277; 357/5; 333/19, 20; 328/127, 128, 65; 505/829, 832, 861, 863, 865, 866

[56] References Cited

U.S. PATENT DOCUMENTS

| | | | |
|---|---|---|---|
| 3,329,835 | 7/1967 | D'Agostino | 307/455 |
| 3,405,287 | 10/1968 | Miller | 329/65 |
| 3,528,018 | 9/1970 | Corson | 328/164 |
| 4,107,554 | 8/1978 | Yao | 307/306 |
| 4,518,868 | 5/1985 | Harada et al. | 307/306 |
| 4,567,383 | 1/1986 | Goto et al. | |
| 4,623,804 | 11/1986 | Goto | |
| 4,749,888 | 6/1988 | Sakai et al. | 307/476 |
| 4,785,426 | 11/1988 | Harada et al. | 365/162 |
| 4,812,689 | 3/1989 | Whiteley | 307/605 |
| 4,902,908 | 2/1990 | Harada | 307/245 |
| 4,947,118 | 8/1990 | Fujimaki | 307/306 |

FOREIGN PATENT DOCUMENTS

3446614A1 7/1985 Fed. Rep. of Germany.
59-143427 8/1984 Japan.
60-134440 7/1985 Japan.
62-102620 5/1987 Japan.

OTHER PUBLICATIONS

Dr.-Ing. E. Buhn, "Radio Fernsehen Elektroniki", vol. 32, No. 4, 1983, pp. 207–211.
Dr. Eiichi Goto, et al., "Quantum Flux Parametron Paves Way to Superhigh-Speed Computers", 2209 J.E.E. Journal of Electronic Engineering 23 (1986 May), No. 233, pp. 62–65.
T. VanDuzer, et al., "Principles of Superconductive Devices and Circuits", Elsevier North Holland, Inc., 1981, pp. 237–244.
K. F. Loe, et al., "Analysis of Flux Input and Output Josephson Pair Device", from IEEE Transactions on Magnetics, vol. MAG-21, No. 2, Mar., 1985, pp. 884–887.
Yutaka Harada, et al., "Basic Operations of the Quantum Flux Parametron", from IEEE Transactions on Magnetics, vol. MAG-23, No. 5, Sep. 1987, pp. 3801–3807.
Yutaka Harada, et al., "Quantum Flux Parametron", from 1987 IEEE, IDEM 87, pp. 389–392.

Primary Examiner—John Zazworsky
Attorney, Agent, or Firm—Fay, Sharpe, Beall, Fagan, Minnich & McKee

[57] ABSTRACT

A switching circuit which comprises a digital circuit formed of a superconductor, a transmission line connected to the digital circuit through magnetic coupling, and a resistor element disposed in the transmission line for differentiating the output of the digital circuit.

37 Claims, 6 Drawing Sheets

SWITCHING CIRCUIT AND ITS SIGNAL TRANSMISSION METHOD

BACKGROUND OF THE INVENTION

The present invention generally relates to an ultra high speed circuit for use in a computer or the like. The invention particularly relates to a switching circuit such as a quantum flux parametron or the like in which no voltage is generated in an output line in the steady state, and relates to a signal transmission method in such a switching circuit.

A quantum flux parametron (hereinafter, simply referred to as a QFP circuit) which is a switching circuit using Josephson Junctions operates at an ultra high speed with a very small quantity of electric power consumption. So the QFP circuit is expected to be put into practical use in a high-performance electronic computer or the like. The configuration and operational principle of such a QFP circuit will be briefly described hereunder, although they are disclosed, for example, in JP-A-59-143427; IEEE TRANSACTION ON MAGNETICS, VOL. MAG-21, No.2, March 1985; IEEE TRANSACTION ON MAGNETICS, VOL. MAG-23, No. 5, September 1987; Proc. IEDM 1987; U.S. Pat. No. 4,785,426; and the like.

FIG. 2 shows the configuration of the conventional QFP circuit. The conventional QFP circuit is provided with a superconducting loop 5 and an activation line 6, the superconducting loop 5 being constituted by Josephson junctions 1 and 2 and inductors 3 and 4. The superconducting loop 5 is connected to an input line 7 and a load inductor 8. A QFP circuit can be wired to another QFP circuit in a succeeding stage. Any succeeding QFP circuits are regarded as inductors. These inductors are collectively represented by one inductor, that is, the load inductor 8. Next, the operation of the thus configured QFP circuit will be briefly described.

First, a weak input current is made to flow in the superconducting loop 5 through the input line 7 under the condition that no activation current, for example, pulse current, is applied to the activation line 6. Then, if an activation current is applied to the activation line 6, an amplified current flows in the load inductor 8 in the positive direction (in the direction from the superconducting loop 5 toward the load inductor 8) or in the negative direction (in the direction from the load inductor 8 toward the superconducting loop 5) corresponding to the direction of the input current due to the physical characteristics of the superconducting loop 5. Here, let the current in the positive direction and the current in the negative direction correspond to logical "1" and "0" respectively. Generally, the input line 7 is connected to a plurality of input terminals. Consequently, if the input terminals are connected respectively to the outputs of QFP circuits in the preceding stage, the direction of the current flowing in the input line 7 is determined by the sum of the outputs. Therefore, it is possible to realize the function of majority logic. A switching circuit using such a QFP circuit has a feature that the quantity of power consumption is very small because no voltage is generated on an output line in the steady state.

SUMMARY OF THE INVENTION

The operational principle of the foregoing QFP circuit is based on the assumption that a loop (hereinafter, referred to as a load loop) starting from the superconducting loop 5 and returning to the same superconducting loop 5 through the load inductor 8 and the ground is in the superconducting stage. Since the resistance value of the load loop is however substantially equal to zero, ringing is caused in a high-speed operation by the self-inductance L of the load loop and the sum stray capacitance C of the Josephson junctions 1 and 2 and the wiring. In order to suppress the ringing, it is necessary to make the value of $\sqrt{L}$ sufficiently small in comparison with the operation time of the circuit. In semiconductor circuits, a transmission line with a matched terminator as wiring has been used in order to suppress ringings. If this method were employed in QFP circuits, it would not satisfy the above-mentioned assumption that the load loop is formed of superconductor and also would pose a problem that the terminator consumes some electric power. As a result, there has been a problem in that wiring between a QFP circuit and another QFP circuit in the succeeding stage cannot be made long. It is also difficult to perform high density integration of the QFP circuit in spite of the fact that the circuit can operate at a high speed with low power consumption.

It is therefore an object of the present invention to solve the foregoing problems in the prior art.

It is another object of the present invention to provide a switching circuit in which a high speed signal can be transmitted without causing the foregoing ringing and without increasing the power consumption, and to provide a signal transmission method of the switching circuit.

In order to attain the foregoing objects, according to another aspect of the present invention, a signal transmission method features that the differential waveform of the output of a signal source such as a digital circuit or the like is transmitted through a transmission line. Further, it is preferable to use the digital circuit in the superconducting state. According to circumstances, the transmission line is used in the superconducting state.

According to a preferable embodiment of the present invention, the signal transmission method features that an output signal of a QFP circuit is transmitted through transformer coupling to a transmission line with a matched terminator.

According to another aspect of the present invention, a switching circuit features a QFP circuit and a transmission line with a matched terminator provided. The output of the QFP circuit is connected to the transmission line through transformer coupling.

According to a further aspect of the present invention, a transmission line drive circuit is constituted by a QFP circuit, a transmission line with matched terminator, and a transformer coupling circuit for connecting an output signal of the QFP circuit to the transmission line through transformer coupling.

According to a still further aspect of the present invention: a switching circuit is constituted by a QFP circuit, a transmission line connected to the QFP circuit through transformer coupling, and means for terminating the transmission line in a matched manner; and a logical operation circuit is constituted by a plurality of the above-mentioned switching circuits and another QFP circuit in the succeeding stage to which the outputs of the plurality of switching circuits are applied in parallel to each other.

According to another aspect of the present invention, a switching circuit is constituted by a digital circuit formed of a superconductor, a transmission line connected to the digital circuit through transformer coupling, and a resistor element disposed in the transmission line so as to differentiate the output of the digital circuit.

There is a power consumption in the resistor provided in the transmission line or the like only in the transient state because a differential waveform is used, so that the power consumption is low on an average.

Since the QFP circuit is connected to the transmission line through transformer coupling, the load loop passes through only the primary side of the transformer, and since the QFP circuit can be formed of a superconductor, the operation of the QFP circuit can be ensured. Further, the waveform is never deteriorated because of use of the transmission line with matched terminator.

DESCRIPTION OF THE PREFERRED EMBODIMENTS

Figure 1:
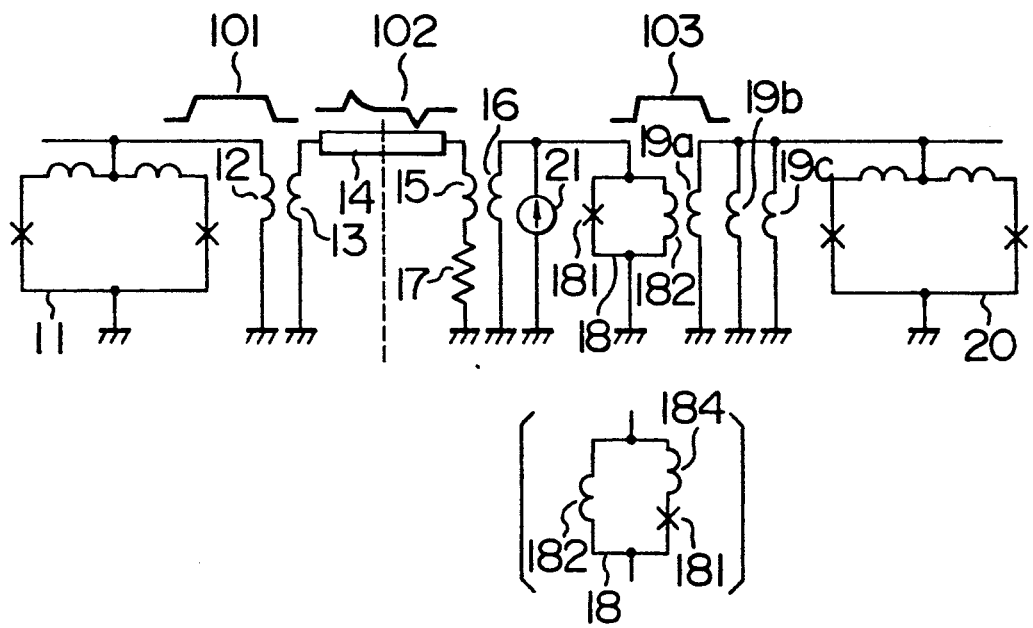
FIG. 1 is a circuit diagram showing an embodiment of the present invention.
Figure 2:
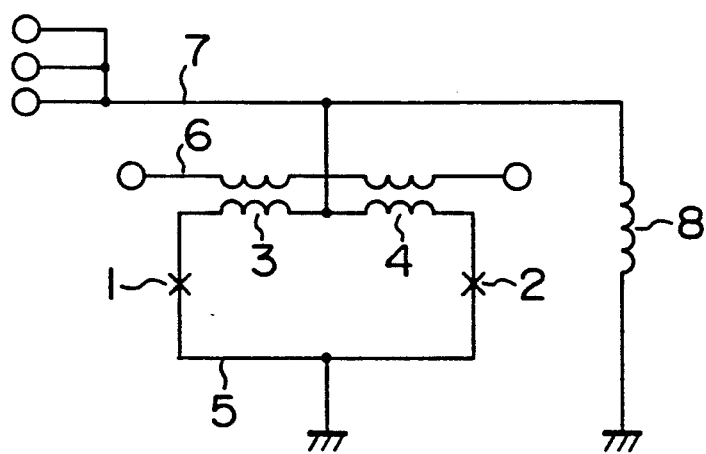
FIG. 2 is a circuit diagram showing the conventional QFP circuit.

Referring to FIG. 1, an embodiment of the present invention will be described hereunder. In FIG. 1, in order to avoid complication of the drawing, an activation line of a QFP circuit is omitted to be illustrated in the drawing. This applies to the drawings of FIG. 3 et seq.

In FIG. 1, an output signal of a QFP circuit 11 is transmitted to a transmission line 14 through two inductors 12 and 13 constituting a transformer. Such a transformer can be realized in a manner such that about 50 $\mu$m length elongated thin-film superconductors of Nb, Pb, or the like constituting the primary and secondary sides of the transformer are disposed in parallel to each other with an insulating layer interposed therebetween. Although the transmission line 14 may be a generally-used stripline or micro-stripline, if the conductor of the transmission line 14 is formed of a superconductor of Nb, Pb, or the like, having no losses, it is possible to prevent deterioration of waveforms during transmission. The whole or a part of the switching circuit of FIG. 1 may be cooled, if necessary, by a liquid helium or the like so that the superconducting state is kept.

The output signal from the transmission line 14 is supplied to an rf-SQUID 18 disposed in the vicinity of a QFP circuit 20 at the succeeding stage through two inductors 15 and 16 constituting a transformer, and terminated by a terminating resistor 17 which is set to be substantially equal to the characteristic impedance of the transmission line 14. The output signal of the rf-SQUID 18 is transmitted to the QFP circuit 20 at the succeeding stage through two inductors 182 and 19a constituting a transformer. The terminating resistor 17 and the inductor 15 may be exchanged in position to each other.

In FIG. 1, reference numeral 101 represents a schematic waveform of an output current of the QFP circuit 11 when it flows into the inductor 12. At this time, such a differential waveform as indicated by reference numeral 102 is induced in the inductor 13 at the secondary side of the transformer. The differential waveform flows into the inductor 15 through the transmission line 14. Here, since the transmission line 14 is matching-terminated by the resistor 17 so that a signal is not reflected again and again at the end of the wiring, deterioration of waveform such as ringing or the like is hardly caused without regard to the length of the signal line. Further, since the current flowing in the terminating resistor 17 has a differential waveform so that it flows only in a transient state, power consumption can be reduced on an average.

The signal current which has flowed in the inductor 15 further flows into the inductor 16 coupled with the inductor 15, and then applied to an rf-SQUID 18 together with a DC current from a constant current regulated power source 21. As is described in detail, for example, in IEEE TRANSACTIONS ON MAGNETICS, Vol. MAG-23, No.5 pp. 3801–3807, September 1987, the rf-SQUID 18 has the characteristic that it stores the direction of the pulse current applied from the inductor 16 and makes a current having a waveform represented by 103 to flow into the inductor 182 so that the rf-SQUID 18 functions as an integrating circuit. The current 103 is transmitted to the QFP circuit 20 in the succeeding stage through the inductor 19a coupled with the inductor 182. Similarly to this, signals of other QFP circuits (not shown in FIG. 1) are received by inductors 19b, 19c, ... to thereby make it possible to realize a majority logic.

When a signal is to be delivered to the inductor 19a from the rf-SQUID 18, a transformer-coupled circuit constituted by an inductor 184 coupled with the inductor 19a may be additionally provided in a branch at the Josephson junction 181 side as shown within brackets in FIG. 1 so that the signal is derived from the rf-SQUID 18 by using the inductor 184 through transformer coupling in place of the inductor 182.

Figure 3:
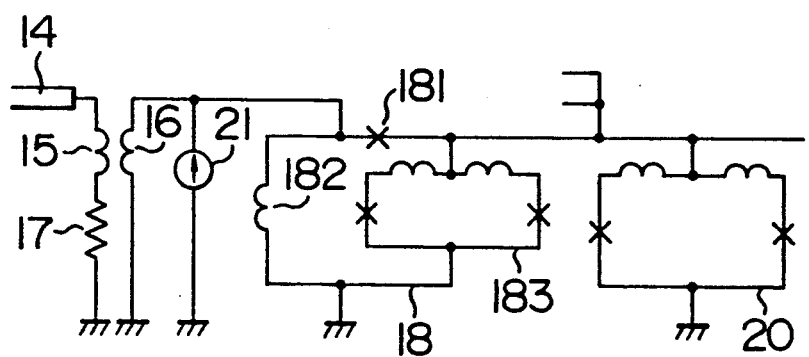
FIGS. 3 to 9 are circuit diagrams showing other embodiments of the present invention.

FIG. 3 shows another embodiment of the present invention. The embodiment of FIG. 3 is different from the embodiment of FIG. 1 only in the right side of the broken line in FIG. 1. In FIG. 3, therefore, illustration of the left side portion of FIG. 1 is omitted. The same applies to FIGS. 4–9.

In the embodiment of FIG. 3, a QFP circuit 183 is provided in a loop of an rf-SQUID 18 so that a signal of the rf-SQUID 18 is amplified and transmitted to another QFP circuit 20 in the succeeding stage. Therefore, the amplitude of the input signal to the QFP circuit 20 is sufficiently large to thereby make it possible to realize a stable operation. In this case, a majority logic function can be realized by directly connecting signals from other QFP circuits (not shown in FIG. 3) to a point between the rf-SQUID 18 and the QFP circuit 20.

Figure 4:
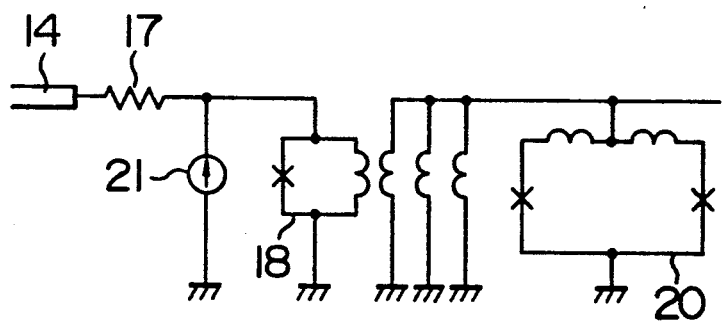

FIG. 4 shows a further embodiment of the present invention. This embodiment features that any loss due to magnetic coupling is not generated, because a signal transmitted through a transmission line 14 is directly supplied into an rf-SQUID 18, not through magnetic coupling (or transformer coupling).

Figure 5:
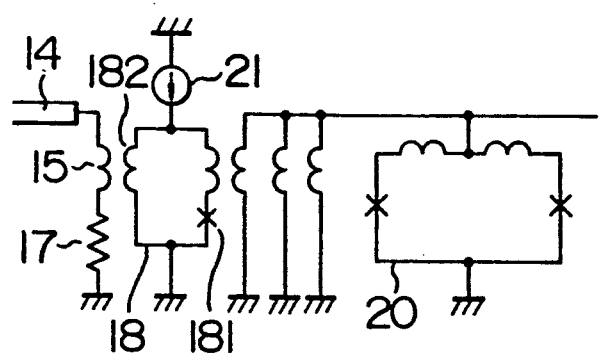

Although the signal current transmitted through the transmission line 14 is made to flow into the rf-SQUID 18 in each of the embodiments of FIGS. 1, 3, and 4, the configuration may be modified such that the magnetic flux in a loop of an rf-SQUID 18 is controlled through inductors 15 and 182 as shown in FIG. 5.

Figure 6:
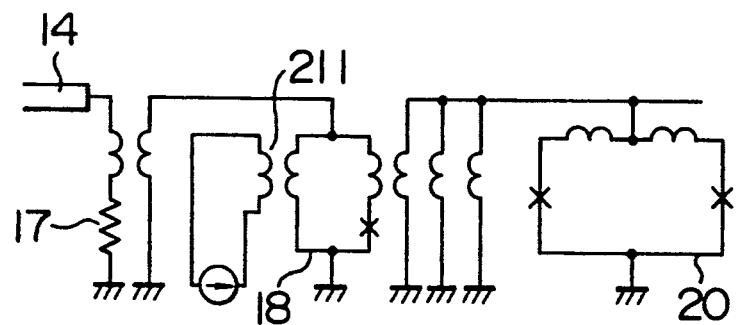

Further, although a bias current to be applied to the rf-SQUID 18 is supplied from the DC current source 21 in each of the embodiments of FIGS. 1, 3, 4 and 5, the configuration may be modified such that the bias current is supplied in the form of DC magnetic flux by using an inductor 211 as shown in FIG. 6.

Figure 7:
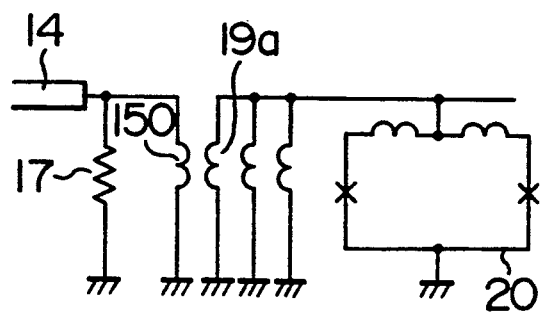

FIG. 7 shows a still further embodiment of the present invention. In this embodiment, a signal from a transmission line 14 is transferred to a QFP circuit 20 in the succeeding stage through an inductor 150 provided in parallel to a terminating resistor 17 and an inductor 19a, in place of the rf-SQUID. In this case, if the time constant determined by the resistor 17 and the inductor 150 is sufficiently large, a current proportional to an integrated value of the signal transmitted through the transmission line 14 flows in the inductors 150 and 19a, and is supplied to the QFP circuit 20 in the succeeding stage. In this configuration, there is an advantage that the configuration of the switching circuit can be simplified because it is not necessary to provide the rf-SQUID 18 and the DC current source 21 for supplying a bias current to the rf-SQUID 18 although there is a limitation that the output pulse width of the QFP circuit 11 is required to be sufficiently small in comparison with the time constant determined by the terminating resistor 17 and the inductor 150.

Figure 8:
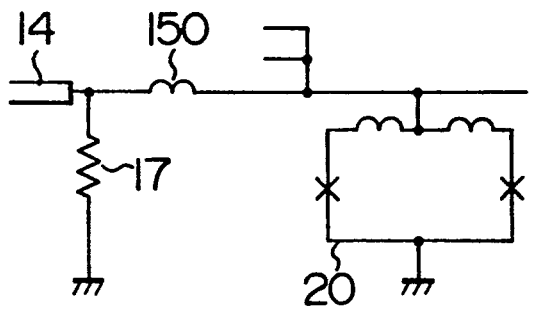

FIG. 8 shows another embodiment of the present invention. This embodiment features that an inductor 150 is directly connected to a QFP circuit 20 in the succeeding stage so that losses due to magnetic coupling are reduced in comparison with the case of FIG. 7. In this configuration, a majority logic function can be realized by directly supplying signals from other QFP circuits (not shown in FIG. 8) to a point between the inductor 150 and the QFP circuit 20 in the succeeding stage.

Figure 9:
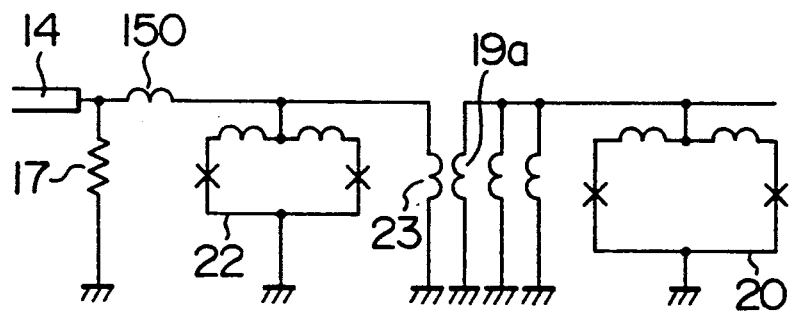

FIG. 9 shows a further embodiment of the present invention. In this embodiment, an inductor 150 is not directly connected to a QFP circuit 20 in the succeeding stage, but a signal from the inductor 150 is transmitted to the QFP circuit 20 in the succeeding stage through inductors 23 and 19a after amplified by another QFP circuit 22, so that the amplitude of the input signal to the QFP circuit 20 in the succeeding stage is sufficiently large to thereby make it possible to realize a stable operation.

Figure 10:
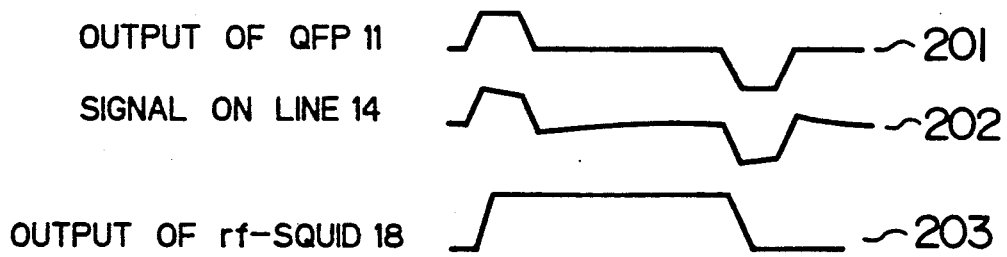
FIG. 10 is a diagram showing waveforms at various portions of the switching circuit according to the present invention.

In the foregoing embodiments, the output of the QFP circuit 11 is differentiated by means of the inductor 13 and the terminating resistor 17. If the output of the QFP circuit 11 is made to have such a waveform as represented by 201 in FIG. 10 and if the time constant determined by the inductor 13 and the terminating resistor 17 is set to be sufficiently large in comparison with the output pulse width of the QFP circuit 11, a current having such a waveform as shown by 202 in FIG. 10 which is substantially proportional to the waveform 201 flows in the inductors 15 and 16. As a result, as the output waveform of the rf-SQUID 18, the same waveform with the waveform 103 of FIG. 1 is obtained. Also in this case, if the pulse width of the output waveform of the QFP circuit 11 is made small, power consumption in the terminating resistor 17 can be reduced on an average.

Figure 11:
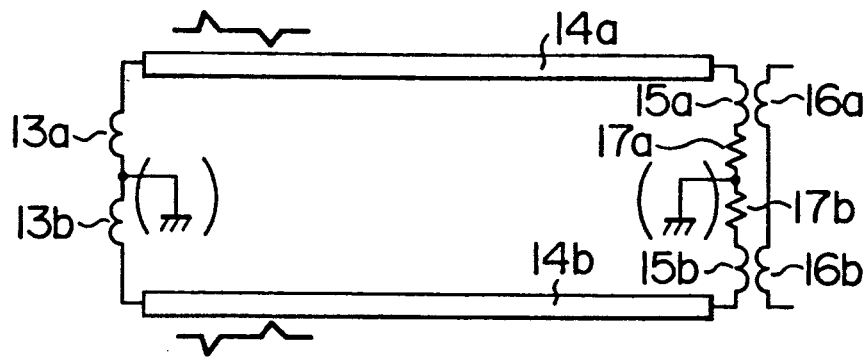
FIGS. 11 to 17 are circuit diagrams showing embodiments of the transmission line and the transmission and reception ends thereof.

In order to reduce the influence of noises from other signals in the transmission line 14 in FIG. 1, a differential signal transmission method may be used. To this end, the configuration with the inductors 13, 15, and 16, the transmission line 14, and the terminating resistor 17 in the embodiment of FIG. 1 is modified to establish such a differential arrangement as shown in FIG. 11. That is, signals having polarities different from each other are transmitted to a pair of transmission lines 14a and 14b through a pair of inductors 13a and 13b so that noise signals induced in the transmission lines 14a and 14b are canceled to each other. Further, the reception side is constituted by a pair of inductors 15a and 15b and a pair of terminating resistors 17a and 17b, and differential signals are supplied to a QFP circuit in the succeeding stage through a pair of transformer-coupling circuits constituted by inductors 16a and 16b coupled with the inductors 15a and 15b, respectively.

If the transmission lines 14a and 14b are formed sufficiently symmetrically with each other and if the quantity of noises is relatively small, the grounding (shown in parentheses) at the transmission and reception ends may be omitted.

Figure 12:
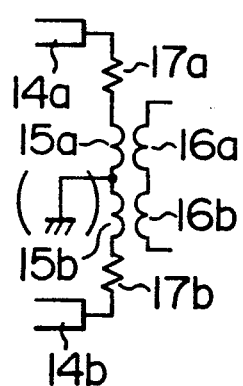
Figure 13:
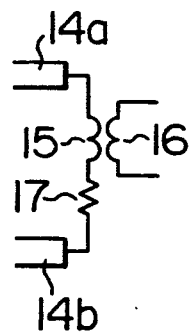

Further, even in the case where the configuration with the inductors 15a, 15b, 16a, and 16b, and the terminating resistors 17a and 17b in FIG. 11 is modified as shown in FIG. 12 or FIG. 13, the same effect can be obtained.

Figure 14:
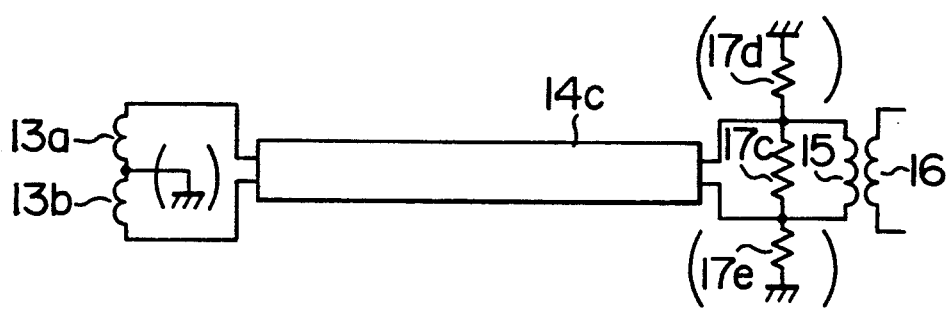
Figure 15:
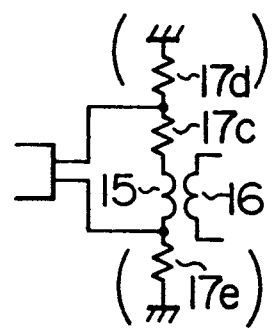

In order to transmit differential signals, the switching circuit may be configured as shown in FIG. 14. In the drawing, a transmission line 14c is formed of a pair of transmission lines coupled with each other, and matching-terminated by terminating resistors 17c, 17d, and 17e. Such a specific arrangement of the transmission line is disclosed, for example, in JP-A-60-134440. In the case where the configuration with the resistors 17c, 17d, and 17e, and the inductors 15 and 16 of FIG. 14 is modified as shown in FIG. 15, the same effect can be obtained. Similarly to the case of FIG. 11, the grounding (shown in parentheses) may be omitted in FIGS. 14 and 15.

Figure 16:
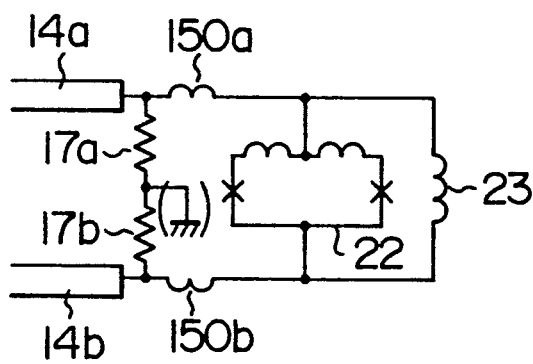
Figure 17:
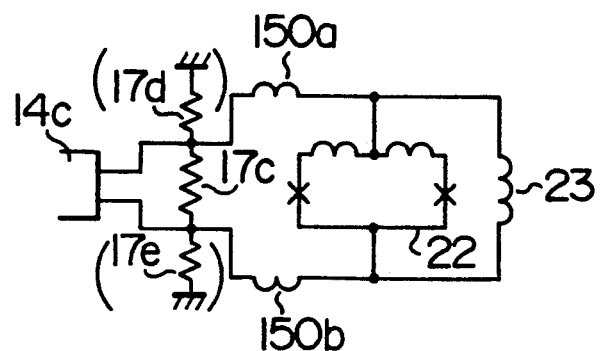

Although the case of transmitting differential signals has been described taking the embodiment of FIG. 1 by way of example, such a configuration for transmitting differential signals can be applied to the embodiments of FIGS. 3, and 5 to 7 in the same manner as in the case of the embodiment of FIG. 1. Further, in the embodiment of FIG. 9, a portion comprised of the transmission line 14, the terminating resistor 17, the QFP circuit 22, and the inductors 150 and 23 may be modified in a manner as shown in FIG. 16 or 17. Also, in those cases of FIGS. 16 and 17, the grounding (shown in parentheses) may be omitted.

If the switching circuits as described above are used, the length of wiring between QFP circuits can be prolonged in comparison with the conventional QFP circuits. If it is directed to effectively use the high speed property of the QFP circuit superior to a generally-used semiconductor device or the like, it is desirable to utilize the QFP circuit with its rise time not longer than about 10–20 ps. In order to set the rise time to 20 ps in the case of using the conventional QFP circuit, it is necessary to establish the square root, $\sqrt{LC}$, of the product between the inductance L and capacitance C of wiring between the circuits to be about 1/10 of the rise time, that is, to be 2 ps or less. If the wiring is constituted by a microstripline of dielectric having a relative dielectric constant of 2.0, the square root of the product between the inductance and the capacitance of the wiring per unit length is 5 ps/mm, and therefore the upper limit of the wiring length is 0.4 mm. In the switching circuit according to the present invention, on the other hand, the wiring length between the QFP circuits (for example, in FIG. 1, the wiring length is the distance between the inductors 13 and 15 and substantially equal to the length of the transmission line 14) is not limited to the value as described above, so that a signal can be transmitted on one large chip. Therefore, for example, about 200,000 circuits can be mounted on one chip of 5 cm×5 cm, that is, it is possible to realize high density circuit integration.

According to the present invention, the output signal of the QFP circuit can be transmitted over a long distance without deteriorating the waveform of the output signal with less power consumption.

We claim:

1. A switching circuit comprising:
   a quantum flux parametron; and,
   a transmission line including a matched terminator wherein an output signal of said quantum flux parametron is supplied to said transmission line through a magnetic coupling and wherein a signal from said transmission line is supplied through a first circuit to another quantum flux parametron in a succeeding stage, said first circuit including means for outputting a first level in response to a first input signal of a first polarity, outputting a second level in response to a second input signal of a second polarity and maintaining one of the first level and the second level in response to a third input signal.

2. The switching circuit according to claim 1 wherein said first circuit is an rf-SQUID.

3. The switching circuit according to claim 1 wherein said first circuit comprises a combination of a resistor and an inductor.

4. The switching circuit according to claim 1 wherein said transmission line is formed of a superconductive material having a length not shorter than 0.4 mm.

5. A signal transmission method comprising steps of:
   transmitting an output signal of a first quantum flux parametron to a transmission line including a matched terminator through a transformer coupling;
   integrating said output signal in a circuit to obtain an integrated signal, said circuit outputting a first level in response to a first input signal of a first polarity, outputting a second level in response to a second input signal of a second polarity and maintaining one of the first level and the second level in response to a third input signal; and
   supplying to a second quantum flux parametron in a succeeding stage said integrated signal.

6. The signal transmission method according to claim 5, wherein said step of transmitting includes transmitting said output signal to a transmission line having a length not shorter than 0.4 mm.

7. A transmission line drive circuit comprising:
   a quantum flux parametron;
   a transmission line including a matched terminator;
   a transformer coupling circuit for connecting an output of said quantum flux parametron to said transmission line through magnetic coupling; and,
   an integrating circuit for integrating a signal from said transmission line and for supplying an integrated signal to another quantum flux parametron in a succeeding stage.

8. The transmission line drive circuit according to claim 11, wherein the transformer coupling circuit further includes means for coupling the output signal of the quantum flux parametron to a pair of transmission lines to generate differential signals, each with respect to time, having opposite polarities.

9. A switching circuit comprising:
   a first digital circuit;
   a transmission line connected to said first digital circuit through magnetic coupling;
   means for matched-terminating said transmission line; and,
   circuit means for outputting a first level in response to a first input signal of a first polarity, outputting a second level in response to a second input signal of a second polarity and maintaining one of the first level and the second level in response to a third input signal.

10. A logic circuit comprising:
    a plurality of switching circuits, each of which includes a first digital circuit, a transmission line connected to said first digital circuit through magnetic coupling, means for match-terminating said transmission line, and circuit means for outputting a first level in response to a first input signal of a first polarity, outputting a second level in response to a second input signal of a second polarity and maintaining one of the first level and the second level in response to a third input signal; and,
    a second digital circuit provided in a succeeding stage for receiving in parallel output signals of said plurality of switching circuits.

11. The logic circuit according to claim 10, wherein each of said first and second digital circuits is a quantum flux parametron comprising a superconducting loop, an activation line magnetically coupled with said superconducting loop, an input line connected to said superconducting loop, and a Josephson junction.

12. The logic circuit according to claim 11, wherein said matched-terminating means are terminating resistors disposed at respective ends of said transmission lines, each of said terminating resistors being set so as to be substantially equal to a characteristic impedance of a corresponding transmission line.

13. The logic circuit according to claim 12, wherein each of said transmission lines of said switching circuits includes an inductor provided in parallel to each of said terminating resistors, and wherein the output signals are supplied in parallel to said second quantum flux parametron in the succeeding stage through magnetic coupling.

14. The logic circuit according to claim 12, wherein each of said transmission lines of said switching circuits includes an inductor provided in parallel to each of said terminating resistors, and wherein said inductors are directly connected in parallel to said second quantum flux parametron in the succeeding stage.

15. The logic circuit according to claim 12, wherein each of said transmission lines of said switching circuits includes an inductor provided in parallel to each of said terminating resistors, and wherein outputs of said inductors are directly connected in parallel to said second quantum flux parametron in the succeeding stage after being amplified by amplifying quantum flux parametrons, respectively.

16. The logic circuit according to claim 11, wherein the output signals of said switching circuits are produced as complementary signals to be supplied to said second quantum flux parametron in the succeeding stage.

17. The logic circuit according to claim 11, wherein a rise time of each of said quantum flux parametrons is not longer than 20 ps.

18. The logic circuit according to claim 11, wherein a minimum value of length of wiring between said first quantum flux parametron and said second quantum flux parametron in the succeeding stage is not shorter than 0.4 mm.

19. The logic circuit according to claim 11, further comprising a plurality of rf-squids, each rf-squid connected to receive a corresponding output signal of a corresponding switching circuit respectively and further including means for integrating said corresponding output signal to form an integrated signal, all integrated signals of the rf-squids being supplied in parallel to said second quantum flux parametron in the succeeding stage.

20. The logic according to claim 19, wherein each of said rf-SQUIDs includes an amplifying quantum flux parametron.

21. The logic circuit according to claim 19, wherein the integrated signals of said rf-SQUIDS are supplied in parallel to said second quantum flux parametron in the succeeding stage through respective wirings magnetically connected to said rf-SQUIDs.

22. The logic circuit according to claim 19, wherein the integrated signals of said rf-SQUIDs are supplied in parallel to said second quantum flux parametron in the succeeding stage through respective wirings directly connected to said rf-SQUIDS.

23. The logic circuit according to claim 19, wherein the output signals are supplied to said plurality of rf-SQUIDs through magnetic coupling.

24. The logic circuit according to claim 19, wherein the output signals are directly supplied to said plurality of rf-SQUIDs.

25. The logic circuit according to claim 19, wherein said transmission lines of said switching circuits are magnetically connected to said plurality of rf-SQUIDs.

26. A signal transmission method comprising the steps of:
maintaining a quantum flux parametron in a superconducting state;
providing a quantum flux parametron output signal by the quantum flux parametron;
differentiating the quantum flux parametron output signal with respect to time for obtaining a differentiated signal; and,
transmitting said differentiated signal through a transmission line.

27. A switching circuit comprising:
a digital circuit comprising a superconductor;
a transmission line connected to said digital circuit through magnetic coupling; and,
a resistor element disposed in said transmission line for differentiating an output of said digital circuit.

28. A switching circuit which operates at high speed with low power consumption adaptable to a logic circuit which includes a plurality of switching circuits connected to accommodate high speed and low power consumption, the switching circuit comprising:
first digital circuit means for generating a first signal, the first digital circuit means including a first superconducting loop;
differentiating means for differentiating the first signal with respect to time to obtain a second signal;
transmission means for transmitting the second signal;
matched terminating means for impedance matching the transmission means;
transforming means for transforming the second signal to obtain a third signal; and,
second digital circuit means for receiving the third signal, the second digital circuit means including a second super-conducting loop;
whereby ringing in the circuit is substantially eliminated by the matched terminating means and whereby the third signal which is received by the second digital circuit means is substantially similar to the first signal.

29. The switching circuit according to claim 28 wherein the first digital circuit means and the second digital circuit means are quantum flux parametrons.

30. The switching circuit according to claim 28 wherein the transforming means is an rf-SQUID.

31. The switching circuit according to claim 28 wherein the transforming means is an integrator.

32. The switching circuit according to claim 28 wherein the matched terminating means is a resistor.

33. The switching circuit according to claim 28 wherein the differentiating means is a magnetic coupling device.

34. A signal transmission method for use in a high speed, low power logic circuit including a quantum flux parametron and a transmission line, the method comprising the steps of:
elevating the quantum flux parametron to a superconducting state;
maintaining the quantum flux parametron in a superconducting state;
generating by the quantum flux parametron of an output signal; and,
transmitting a differential waveform of the output signal of the quantum flux parametron through a transmission line.

35. A signal transmission method for use in a high speed, low power logic circuit including a signal source and a transmission line including a resistor and an inductor connected thereto, the method comprising the steps of:
elevating the signal source to a superconducting state;
maintaining the signal source in a superconducting state;
generating, by the signal source, an output signal;
differentiating the output signal by the resistor and the inductor connected to the transmission line to obtain a differential waveform; and,
transmitting the differential waveform of the output signal of the signal source through the transmission line.

36. A switching circuit comprising:
a first logic circuit;
a second logic circuit;
a differentiating means for differentiating an output signal of said first logic circuit with respect to time to obtain a first signal, said differentiating means including a transmission line with a matched terminator; and,
an integrating means for integrating said first signal from said transmission line to obtain a second signal, and for supplying said second signal to said second logic circuit.

37. The switching circuit according to claim 36, wherein said differentiating means further comprises a resistor element being used as said matched terminator and an inductor element so as to differentiate said output signal with respect to time.

* * * * *

UNITED STATES PATENT AND TRADEMARK OFFICE
CERTIFICATE OF CORRECTION

| | | |
|---|---|---|
| PATENT NO. | : | 5,146,119 |
| DATED | : | September 8, 1992 |
| INVENTOR(S) | : | Ryotaro Kamikawai, et al. |

It is certified that error appears in the above-identified patent and that said Letters Patent is hereby corrected as shown below:

Claim 19, column 9, lines 12-13, delete "further including means for".

Signed and Sealed this

Thirty-first Day of August, 1993

*Attest:*

*Attesting Officer*

BRUCE LEHMAN

*Commissioner of Patents and Trademarks*